(12) United States Patent
Zhang et al.

(10) Patent No.: US 9,336,079 B2
(45) Date of Patent: May 10, 2016

(54) SYSTEM AND METHOD FOR CYCLE SLIP CORRECTION

(71) Applicant: Tyco Electronics Subsea Communications LLC, Eatontown, NJ (US)

(72) Inventors: Hongbin Zhang, Marlboro, NJ (US); Hussam G. Batshon, Eatontown, NJ (US)

(73) Assignee: TYCO ELECTRONICS SUBSEA COMMUNICATIONS LLC, Eatontown, NJ (US)

( * ) Notice: Subject to any disclaimer, the term of this patent is extended or adjusted under 35 U.S.C. 154(b) by 87 days.

(21) Appl. No.: 14/103,705

(22) Filed: Dec. 11, 2013

(65) Prior Publication Data

US 2015/0160997 A1 Jun. 11, 2015

(51) Int. Cl.
| | |
|---|---|
| G06F 11/00 | (2006.01) |
| H03M 13/00 | (2006.01) |
| G06F 11/10 | (2006.01) |
| H04B 10/54 | (2013.01) |
| H04B 10/516 | (2013.01) |
| H04B 10/60 | (2013.01) |
| H03M 13/11 | (2006.01) |
| H04L 1/00 | (2006.01) |

(52) U.S. Cl.
CPC .............. *G06F 11/10* (2013.01); *H03M 13/11* (2013.01); *H04B 10/516* (2013.01); *H04B 10/54* (2013.01); *H04B 10/60* (2013.01); *H04L 1/004* (2013.01)

(58) Field of Classification Search
CPC ...... G06F 11/10; H04B 10/54; H04B 10/516; H04B 10/60; H03M 13/11; H04L 1/004
See application file for complete search history.

(56) References Cited

U.S. PATENT DOCUMENTS

| | | | | |
|---|---|---|---|---|
| 6,195,396 | B1 * | 2/2001 | Fang et al. | 375/261 |
| 8,295,713 | B2 | 10/2012 | Cai | |
| 2013/0216221 | A1 | 8/2013 | Zhang et al. | |
| 2014/0281832 | A1 | 9/2014 | Zhang et al. | |

FOREIGN PATENT DOCUMENTS

| | | |
|---|---|---|
| EP | 2124344 A1 | 11/2009 |
| EP | 2639962 A1 | 9/2013 |

OTHER PUBLICATIONS

International Search Report, International Application No. PCT/US2014/068540, International Filing Date Dec. 4, 2014.
Batshon et al., "Coded Modulation for Undersea Optical Fiber Communications", Asia Communications and Photonics Conference 2014, Nov. 11, 2014, pp. 1-3.
Zhang et al., "Coded Modulation and Approaching Nonlinear Shannon Limit", The European Conference on Optical Communication (ECOC), Systematic Paris Region Systems and ICT Cluster, Sep. 21, 2014, pp. 1-3.

* cited by examiner

*Primary Examiner* — Sam Rizk

(57) ABSTRACT

A system and method including a parity bit encoder for encoding bits of data to be transmitted with first and second parity check bits to produce successive block of bits. Each of the blocks of bits are Gray mapped to a plurality of associated QAM symbols that are modulated onto an optical wavelength and transmitted to a receiver. A de-mapper corrects for 90 degree and 180 degree cycle slip using parity indicated by the first and second parity bits.

17 Claims, 7 Drawing Sheets

SYSTEM AND METHOD FOR CYCLE SLIP CORRECTION

TECHNICAL FIELD

The present disclosure relates to optical signal data detection and more particularly, to a system and method for correcting cycle slip in an optical communication system.

BACKGROUND

In wavelength division multiplexed (WDM) optical communication systems, a number of different optical carrier wavelengths are separately modulated with data to produce modulated optical signals. The modulated optical signals are combined into an aggregate signal and transmitted over an optical transmission path to a receiver. The receiver detects and demodulates the data.

One type of modulation that may be used in optical communication systems is phase shift keying (PSK). According to different variations of PSK, data is transmitted by modulating the phase of an optical wavelength such that the phase or phase transition of the optical wavelength represents symbols encoding one or more bits. In a binary phase-shift keying (BPSK) modulation scheme, for example, two phases may be used to represent 1 bit per symbol. In a quadrature phase-shift keying (QPSK) modulation scheme, four phases may be used to encode 2 bits per symbol. Other phase shift keying formats include differential phase shift keying (DPSK) formats and variations of PSK and DPSK formats, such as return-to-zero DPSK (RZ-DPSK) and polarization division multiplexed QPSK (PDM-QPSK).

A modulation format, such as QPSK wherein multiple information bits are be encoded on a single transmitted symbol may be generally referred to as a multi-level modulation format. Multi-level modulation techniques have been used, for example, to allow increased transmission rates and decreased channel spacing, thereby increasing the spectral efficiency (SE) of each channel in a WDM system. One spectrally efficient multi-level modulation format is quadrature amplitude modulation (QAM). In a QAM signal, information is modulated using a combination of phase shift keying and amplitude shift keying, for example, to encode multiple bits per symbol. A 16-QAM modulation format may be used, for example, to encode 4 bits per symbol. PSK modulation schemes (e.g., BPSK and QPSK) may be referred to as a level of QAM (e.g., 2QAM and 4QAM respectively).

In phase modulated optical communication systems using, for example, a QAM scheme, the receiver may be a coherent receiver using coherent detection, e.g. homodyne or heterodyne detection, to detect modulated optical signals. The term "coherent" when used herein in relation to a receiver refers to a receiver including a local oscillator (LO) for demodulating the received signal. Digital signal processing (DSP) may be implemented in such systems for processing the received signals to provide demodulated data. Digital signal processing of the received signal provides speed and flexibility, and may be used to perform a variety of functions including correction of nonlinearities associated with the optical transmission path such as chromatic dispersion, polarization mode dispersion, etc.

Coherent detection schemes for phase modulated systems may use absolute phase detection. Absolute phase detection may involve making a decision, e.g. a soft decision, regarding the value of each bit in the received data stream based on an estimated phase. Unfortunately, for $M^2$-QAM, e.g., QPSK and 16 QAM, the signal constellation is invariant under a phase rotation of angle $\pi/2$. The carrier phase estimator used to determine the estimated phase cannot distinguish between an angle $\theta$ and an angle $\theta+\pi/2$. As a result, the estimated carrier phase may be pushed away from the current stable operating point into the domain of attraction of a neighboring stable operating point, which effectively rotates the signal constellation by $\pi/2$. This phenomenon is referred to as cycle slip. The cycle slip can generate a large number of decision errors after the cycle slip event. The effect of cycle slip can be limited to the duration of actual slip by using differential decoding of the information symbols. However, the differential decoding can have about twice the bit error rate of the absolute phase detection.

One approach for correcting cycle slip is to introduce pilot symbols with known information symbols. The pilot symbols remove the phase ambiguity since the carrier phase of the pilot symbol can be unambiguously estimated by calculating the difference of the phase between the received pilot symbol and the known information symbols. However, the overhead of the pilot symbol causes a larger symbol rate resulting in a sensitivity penalty. To address this, pilot symbols may be inserted with a large period. In general, it may take about half the number of symbols between pilot symbols period before the cycle slip is detected and the carrier phase reference is corrected. The time it takes to make the correction can result in burst errors in the detected data.

BRIEF DESCRIPTION OF THE DRAWINGS

Reference should be made to the following detailed description which should be read in conjunction with the following figures, wherein like numerals represent like parts.

DETAILED DESCRIPTION

In general, a system consistent with the present disclosure encodes a plurality of bits, e.g. n bits, of data to be transmitted with two parity check bits to provide successive blocks of bits, e.g. blocks of n+2 bits. Each of the blocks of bits are Gray mapped to a plurality of associated QAM symbols that are modulated onto an optical carrier and transmitted to a receiver. The receiver detects the symbols and corrects for cycle slip. In one embodiment, for example, the symbols associated with each block of bits may be decoded by selecting the symbols having correct parity indicated by the first and second parity bits. Advantageously, the signal can be detected at the receiver with no phase ambiguity over the entire 360 degree phase plane.

As used herein a "Gray map" or "Gray mapping" refers to the known Gray mapping scheme whereby a code is assigned to each of a contiguous set of bits such that adjacent code words differ by one bit and does not involve adding additional bits to a data stream (i.e. Gray mapping has no overhead). The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals.

Figure 1:
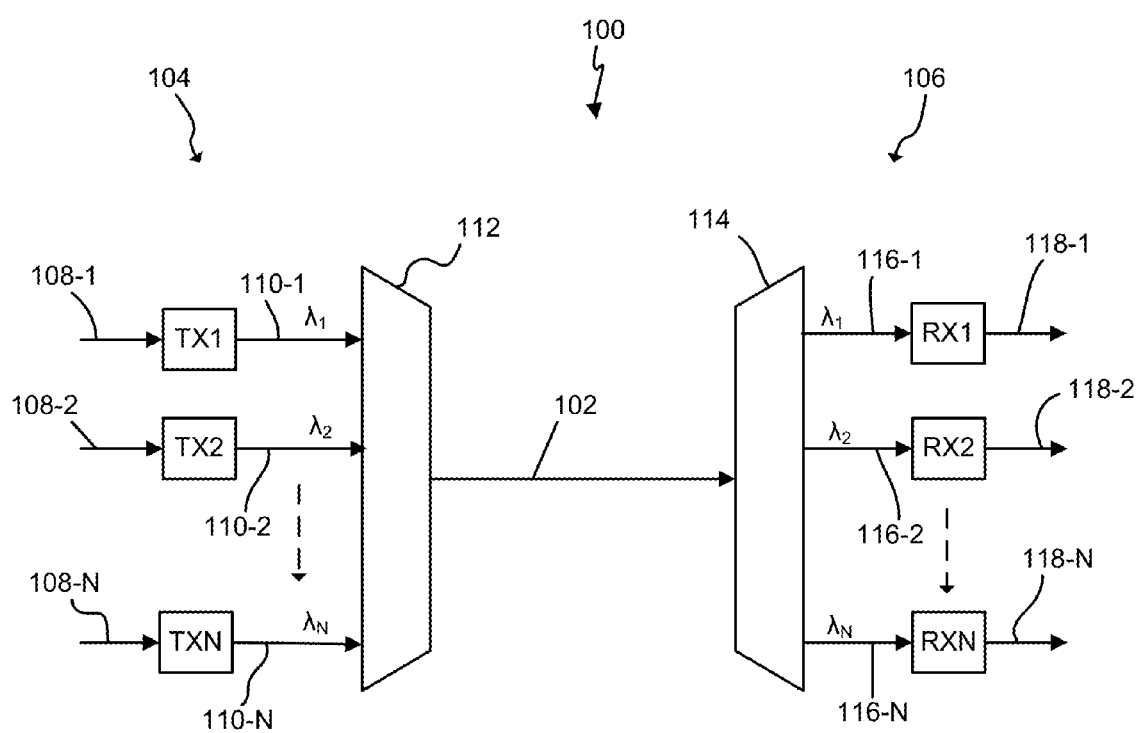
FIG. 1 is a block diagram of one exemplary embodiment of a system consistent with the present disclosure.

FIG. 1 is a simplified block diagram of one exemplary embodiment of a WDM transmission system 100 consistent with the present disclosure. The transmission system serves to transmit a plurality of optical channels over an optical information path 102 from a transmitting terminal 104 to one or more remotely located receiving terminals 106. The exemplary system 100 may be a long-haul submarine system configured for transmitting the channels from a transmitter to a receiver at a distance of 5,000 km, or more. Although exemplary embodiments are described in the context of an optical system and are useful in connection with a long-haul WDM optical system, the broad concepts discussed herein may be implemented in other communication systems transmitting and receiving other types of signals.

Those skilled in the art will recognize that the system 100 has been depicted as a highly simplified point-to-point system for ease of explanation. For example, the transmitting terminal 104 and receiving terminal 106 may, of course, both be configured as transceivers, whereby each may be configured to perform both transmitting and receiving functions. For ease of explanation, however, the terminals are depicted and described herein with respect to only a transmitting or receiving function. It is to be understood that a system and method consistent with the disclosure may be incorporated into a wide variety of network components and configurations. The illustrated exemplary embodiments herein are provided only by way of explanation, not of limitation.

In the illustrated exemplary embodiment, each of a plurality of transmitters TX1, TX2 . . . TXN receives a data signal on an associated input port 108-1, 108-2 . . . 108-N, and transmits the data signal on associated wavelength $\lambda_1, \lambda_2 \ldots \lambda_N$. One or more of the transmitters TX1, TX2 . . . TXN may be configured to modulate data on the associated wavelength in a manner consistent with the present disclosure. The transmitters, of course, are shown in highly simplified form for ease of explanation. Those skilled in the art will recognize that each transmitter may include electrical and optical components configured for transmitting the data signal at its associated wavelength with a desired amplitude and modulation.

The transmitted wavelengths or channels are respectively carried on a plurality of paths 110-1, 110-2 . . . 110-N. The data channels are combined into an aggregate signal on optical path 102 by a multiplexer or combiner 112. The optical information path 102 may include optical fiber waveguides, optical amplifiers, optical filters, dispersion compensating modules, and other active and passive components.

The aggregate signal may be received at one or more remote receiving terminals 106. A demultiplexer 114 separates the transmitted channels at wavelengths $\lambda_1, \lambda_2 \ldots \lambda_N$ onto associated paths 116-1, 116-2 . . . 116-N coupled to associated receivers RX1, RX2 . . . RXN. One or more of the receivers RX1, RX2 . . . RXN may be configured to demodulate the transmitted signal using iterative decoding and may provide an associated output data signal on an associated output path 118-1, 118-2, 118-3, 118-N.

Figure 2:
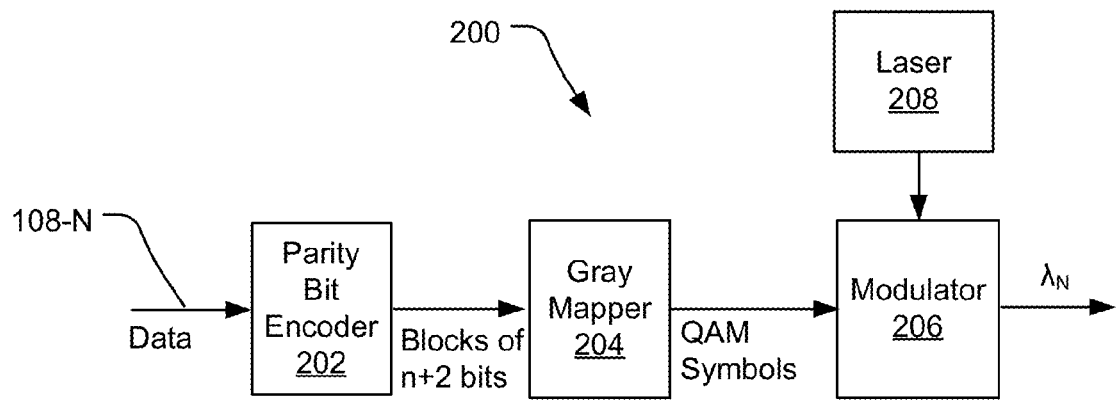
FIG. 2 is a block diagram of one exemplary embodiment of a transmitter consistent with the present disclosure.

FIG. 2 is a simplified block diagram of one exemplary transmitter 200 consistent with the present disclosure. For simplicity and ease of explanation, embodiments may be described herein in connection with encoding blocks of n bits with first and second parity bits to provide blocks of n+2 bits. It is to be understood, however, that a system consistent with the present disclosure may be provided in other configurations including first and second parity bits and may include additional encoding bits. The exemplary embodiments described herein are thus provided by way of illustration, not of limitation.

The illustrated exemplary embodiment 200 includes a parity bit encoder 202, a Gray mapper 204, and a modulator 206 for modulating the output of a continuous-wave laser 208 for providing a coded and modulated output on a carrier wavelength $\lambda_N$. The parity bit encoder 202 may be configured to encode each n information bits of a data stream provided on input path 118-N with first and second associated parity bits. The output of the parity bit encoder 202 includes successive blocks of n+2 bits, i.e. n information bits plus the first and second parity bits.

The encoded output of the parity bit encoder is coupled to the Gray mapper 204. The Gray mapper 204 is configured map each block of n+2 bits to an associated plurality of QAM symbols. The plurality of QAM symbols associated with each block of n+2 bits are modulated onto an optical carrier wavelength $\lambda_N$ of the continuous-wave laser 208 using the modulator 206. The modulator 206 may modulate the plurality of QAM symbols onto the carrier wavelength $\lambda_N$ using any known modulation method. The encoded, mapped and modulated output of the modulator 206 may be coupled to the multiplexer 112 (FIG. 1) in a WDM system.

Advantageously, the first parity bit added to the block of n bits by the parity bit encoder 202 identifies, in a known manner, whether the number of bits with a value of one in the associated n information bits is even or odd. The second parity bit added to the block of n bits by the parity bit encoder 220 identifies, in a known, manner whether the number of bits with a value of one in the in-phase bits (or in the quadrature bits) of the QAM symbols associated with the block of n+2 bits is even or odd.

As is known, a parity bit may be an even parity bit or an odd parity bit. When using even parity, the parity bit is set to a value of one if the number of ones in the n information bits associated with the parity bit (not including the parity bit) is odd. If the number of ones in the n information bits is already even, the even parity bit is set to a 0. When using odd parity, the parity bit is set to 1 if the number of ones in the n information bits associated with the parity bit (not including the parity bit) is even. When the number of ones in the n information bits is already odd, the odd parity bit is set to 0. Hardware and software configurations for encoding each n bits of input data with an even or odd parity bit in the parity bit encoder 202 are known to those of ordinary skill in the art.

Figure 3:
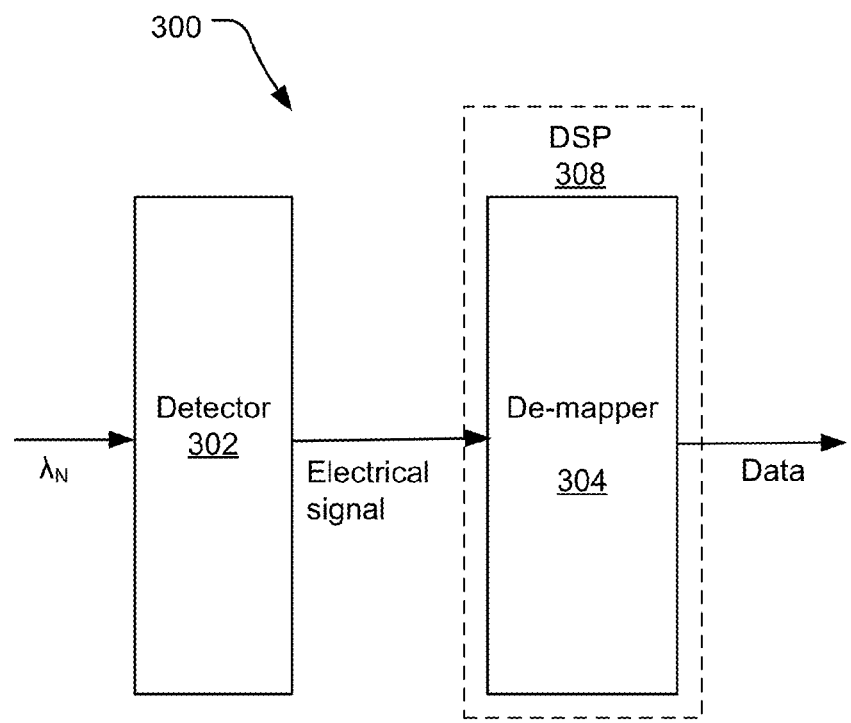
FIG. 3 is a block diagram of one exemplary embodiment of a receiver consistent with the present disclosure.

FIG. 3 is a simplified block diagram of one exemplary receiver 300 consistent with the present disclosure. The illustrated exemplary embodiment 300 includes an optical signal detector 302 and a de-mapper 304. The detector 302 may include a known coherent receiver, e.g. a polarization diversity coherent receiver, configured to receive the signal on the optical carrier wavelength $\lambda_N$ and convert the optical signal into one or more associated electrical outputs (e.g. an output associated with each polarization in a polarization multiplexed modulation format) representative of the QAM symbols modulated on the optical carrier wavelength $\lambda_N$ by the modulator 206 (FIG. 2).

The de-mapper 304 may be configured as a portion of a digital signal processing (DSP) circuit 308. In general, DSP involves processing of signals using one or more application specific integrated circuits (ASICS) and/or special purpose processors configured for performing specific instruction sequences, e.g. directly and/or under the control of software instructions. One example of a receiver incorporating a detector, i.e. a coherent receiver, and a DSP circuit using carrier phase estimation for processing the digital outputs of the coherent receiver is described in U.S. Pat. No. 8,295,713, the teachings of which are hereby incorporated herein by reference.

With reference to both FIGS. 2 and 3, the DSP circuit 308 may process the output of the detector 302 and provide an output that reproduces data provided at the input 108-N to the transmitter 200. The de-mapper 304 receives the electrical output of the detector 302 and uses a carrier phase estimation function to reverse the mapping applied by the Gray mapper 204 and remove the parity bits applied by the parity bit encoder 202. The output of the de-mapper is a de-mapped output representative of the successive blocks of n bits of data provided at the input 108-N to the transmitter 200.

De-mapping may be performed, for example using a maximum a posteriori (MAP) detector. The de-mapper 304 in a system consistent with the present disclosure may cause correction of cycle slip using parity indicated by the parity bits applied by the parity bit encoder 202. In some embodiments, for example, the de-mapper 304 may use the parity bits to perform de-mapping in a manner that automatically causes correction of cycle slip.

The blocks of n+2 bits (n information bits and two associated parity bits) provided at the output of the parity bit encoder 202 may be mapped to a plurality of QAM symbols by the Gray mapper 204 in a variety of ways. In one embodiment, for example, the Gray mapper 204 may map each block of n+2 consecutive bits at the output of the parity bit encoder 202 to an odd number of QAM symbols. For example, 12 consecutive bits (10 information bits and two associated parity bits) may be mapped to three 16-QAM symbols, 6 consecutive bits (4 information bits and two associated parity bits) may be mapped to three QPSK (4-QAM) symbols, etc. With this configuration, each block of n+2 bits associated with each group of an odd number of QAM symbols will have either an even or odd number of "1s", depending on whether the first parity bit is generated from an XOR of information bits or an XNOR of information bits. In addition, the combined in-phase bits (or the quadrature bits) of the odd number of QAM symbols will have parity indicated by the second parity bit. At the receiver 300, the odd number of QAM symbols may be de-mapped by the de-mapper 304 using a MAP detector configured to select bits associated with a plurality of Gray mapped QAM symbols having correct parity indicated by the first and second parity bits.

Figure 4:
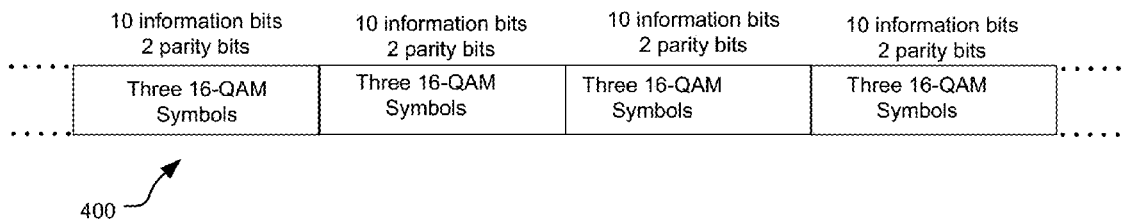
FIG. 4 diagrammatically illustrates a modulated output of an exemplary transmitter consistent with the present disclosure.
Figure 5:
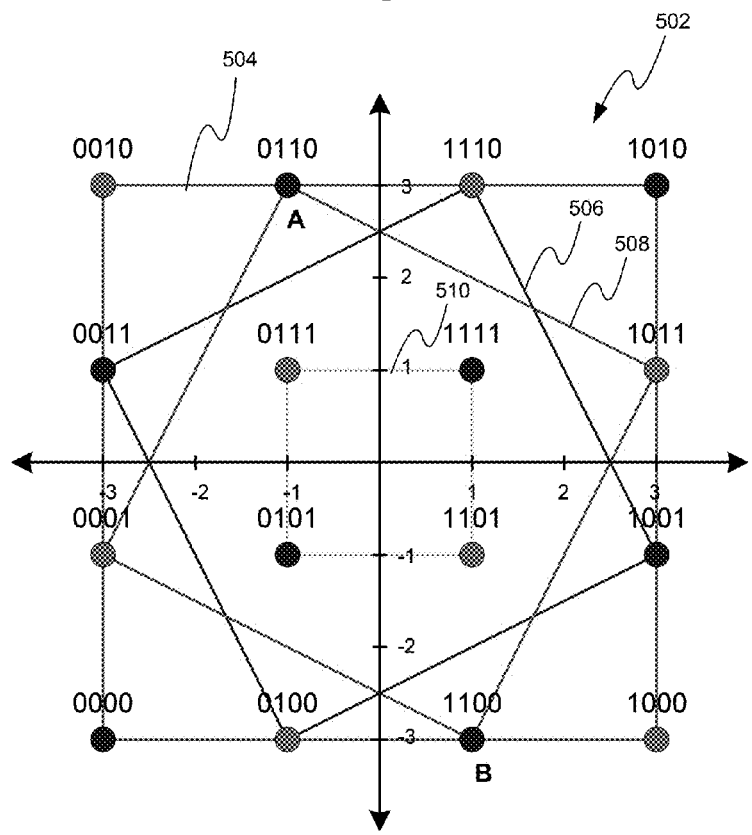
FIG. 5 is a constellation diagram of one exemplary embodiment of a 16-QAM signal with constellation points interconnected to illustrate symbols associated with 90 degree and 180 degree phase errors in a system consistent with the present disclosure.

For example, FIG. 4 diagrammatically illustrates a modulated output 400 consistent with the present disclosure wherein the parity bit encoder 202 encodes each consecutive 10 information bits (n=10) with a two parity bits to provide blocks of 12 bits to the Gray mapper 204. FIG. 5 is a constellation diagram 502 illustrating Gray mapping of a 16-QAM signal. In a known manner, the constellation diagram of FIG. 5 illustrates a plurality of constellation points indicating the amplitude and phase of each QAM symbol, along with the bits (code word) associated with the symbol.

In the illustrated embodiment, the Gray mapper 204 maps each consecutive block of 12 bits (10 information bits plus 2 parity bits) to three 16-QAM symbols with each symbol mapped to a constellation point in the constellation diagram shown in FIG. 5. As shown, the resulting modulated signal includes consecutive groups of three 16-QAM symbols associated with each consecutive block of 12 bits provided at the output of the parity bit encoder 202. If odd parity is used, the parity bit encoder encodes a first odd parity bit indicating the number of "1s" in bits associated with the consecutive groups of three 16-QAM symbols associated with each block of n+2 bits is an odd number. In addition, the parity bit encoder encodes a second odd parity bit indicating the number of "1s" in the combined in-phase bits (or the quadrature bits) of the consecutive groups of three 16-QAM symbols associated with each block of n+2 bits is an odd number. Although the illustrated embodiment is described in connection with an odd parity bit imparted by the parity bit encoder 202, those of ordinary skill in the art will recognize that the parity bit encoder could alternatively encode each n information bits with an even parity bit.

At the receiver 300, the de-mapper 304 may detect and correct for cycle slip by using the first and second parity bits encoded by the parity bit encoder 202 and characteristics of Gray mapped $M^2$-QAM that: (1) the parity associated with the mapped bits changes after every 90 degree phase rotation for each symbol; and (2) the in-phase (I) bits of each symbol and the quadrature bits (Q) of each symbol change parity after every 180 degree phase rotation. These characteristics are illustrated in FIG. 5 by the squares 504, 506, 508, 510 interconnecting the constellation points. The corner of each square is positioned on a constellation point that is 90 degrees from the constellation points on the adjacent corners. For any constellation point: (1) the constellation points that are ±90 degrees therefrom have different parity, and (2) the constellation points that are ±180 degrees therefrom have in-phase bits, i.e. the two most-significant bits (MSB) for each symbol in the illustrated embodiment, and quadrature bits, i.e. the two least-significant bits (LSB) for each symbol in the illustrated embodiment, with different parity.

Figure 6:
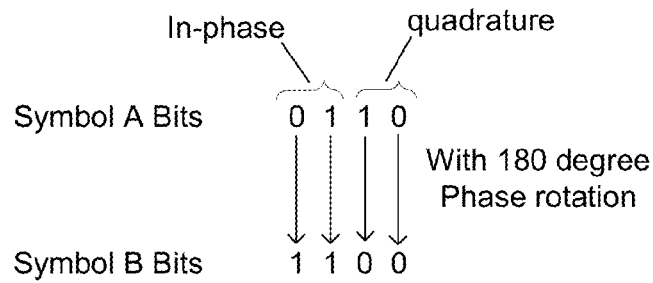
FIG. 6 diagrammatically illustrates bit changes in in-phase and quadrature bits upon occurrence of a 180 degree phase error in a system consistent with the present disclosure.

For example the 16-QAM symbol associated with bits (1 1 1 0) will change to the 16-QAM symbol associated with bits (0 0 1 1) or bits (1 0 0 1) after 90 degree phase rotation. The bits (1 1 1 0) have different parity compared to the bits (0 0 1 1) or bits (1 0 0 1). FIG. 6 diagrammatically illustrates the bits associated with the 16-QAM symbol labeled A in FIG. 5 and the bits associated with the 16-QAM symbol B in FIG. 5, which is at a 180 degree phase rotation from symbol A. As shown, the in-phase bits (the two MSBs) and the quadrature bits (the two LSBs) associated with symbol A change parity with a 180 degree phase rotation to the bits associated with symbol B.

These rules are true for any $M^2$-QAM with Gray mapping, where M is the number of bits encoded by a symbol. In particular, for an $M^2$-QAM symbol I+Qi is generated by mapping $\log_2$ (M) binary bits into M-pulse amplitude modulation (PAM) in both the real (I) and imaginary or quadrature (Q) parts independently. As illustrated for example in FIG. 6, a 16-QAM symbol includes two in-phase (I) bits and two quadrature (Q) bits. With I and Q as real numbers and Gray mapping, the PAM has a property that, Parity(I)≈Parity(−I) and Parity(Q)≈Parity(−Q)

This is because with Gray mapping the two nearest symbols with opposite sign have only one bit difference so that the parity of these two symbols is different. The parity of QAM symbols are Parity(I+Qi)=Parity(I)XOR Parity(Q)

Parity(I−Qi)=Parity(I)XOR Parity(−Q)

Therefore,

Parity(I+Qi)≈Parity(I−Qi)

On the other hand, exchanging real and imaginary part of the $M^2$-QAM symbol does not change the parity Parity(I−Qi)=Parity(−Q+Ii)

Therefore, π/2 phase rotation of symbol $(I+Qi)e^{j\pi/2}=-Q+Ii$ changes the parity, e.g. as shown in FIG. 5. In addition, the parity of the in-phase and quadrature bits of an $M^2$-QAM symbol change with a 180 degree phase rotation since:

Parity(I)≈Parity(−I) and Parity(Q)≈Parity(−Q)

Since the parity of the bits associated with Gray mapped $M^2$-QAM symbols changes with every 90 degree phase rotation and the parity of the in-phase and quadrature bits of the symbols changes with every 180 degree phase rotation, mapping blocks of n+2 bits (n information bits and 2 associated parity bits) to an odd number of QAM symbols i.e. 1 symbol, 3 symbols, 5 symbols, etc., can be used to detect and correct 90 and 180 degree phase rotations (cycle slip), thereby providing the ability to detect and correct for cycle slip in the entire 360 degrees of the phase plane.

For example, in a system wherein n+2 bits are mapped to three $M^2$-QAM symbols so that parity of all bits of the symbols is odd and the parity of all the in-phase (I) bits is even, Table 1 below shows parity changes with phase rotation:

| φ | parity of all 3 symbol bits | parity of all I-phase bits |
|---|---|---|
| 0 | odd | even |
| 90 | even | even |
| 180 | odd | odd |
| 270 | even | odd |

In a system consistent with the present disclosure the above described parity characteristics can be used to correct for 90 degree and 180 degree phase rotation in a variety of ways. For example, to correct for phase rotation/cycle slip in an embodiment wherein 12 bits are mapped to three 16-QAM symbols, at the de-mapper 304 may implement a modified blind phase search (BPS) algorithm followed by maximum-likelihood (ML) phase estimate. The BPS algorithm is known and employs a feed-forward configuration. Hybrid BPS and ML phase estimation methods are known to reduce the number of steps of phase rotation in BPS. However, because a system consistent with the present disclosure removes phase ambiguity using the first and second parity bits, the de-mapper 304 can rotate the received block of signal Y by N test carrier phase angles $\phi_j$ in the whole $2\pi$ phase plane as illustrated diagrammatically in FIG. 7.

Figure 7:
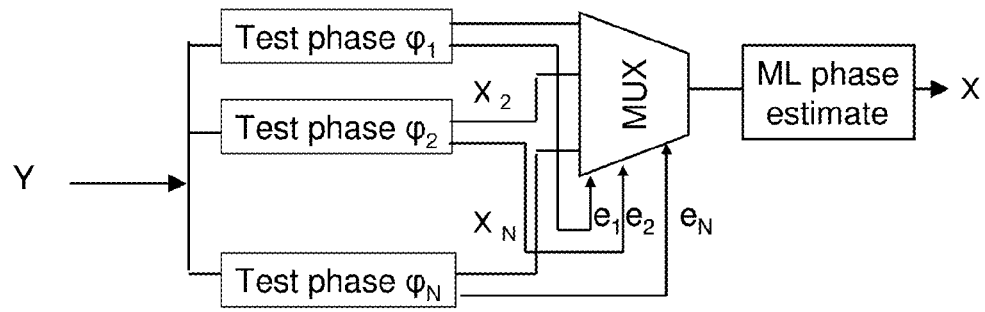
FIG. 7 is a block diagram a BPS/MP algorithm useful in a de-mapper of a system consistent with the present disclosure.
Figure 8:
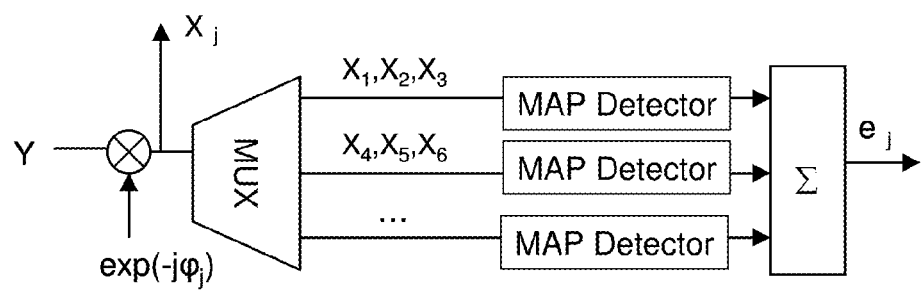
FIG. 8 illustrates an example of a square distance calculation useful in the test phase block of the BPS/MP algorithm shown in FIG. 7.

In each test phase step shown in FIG. 7, the rotated symbols $X_j$ are demultiplexed into M groups of 3 symbols (in this exemplary embodiment) that are provided to associated maximum a posteriori (MAP) detectors, as shown in FIG. 8.

The MAP table may be designed to satisfy the property of parity at 0 degree phase rotation shown in Table 1 above. The square distance from MAP detector may be calculated by:

$$e_j = \sum_{m=0}^{M-1} \sum_{n=0}^{2} |X_{3m+n} - [X_{3m+n}]|^2$$

where $[X_{3m}]$, $[X_{3m+1}]$, $[X_{3m+2}]$ are selected from the MAP table to give the minimum squared distance from the rotated symbol $X_{3m}$, $X_{3m+1}$, $X_{3m+2}$. The optimal phase angle may then selected by determining the minimum squared distance and used as a rough estimate for the second stage of ML phase estimator.

In the ML phase estimate, a fine tuning of phase angle may be calculated as $$\varphi_{ML} = \arg\left(\sum_{m=0}^{M-1} \sum_{n=0}^{2} X_{3m+n}[X_{3m+n}]^*\right)$$

Figure 9:
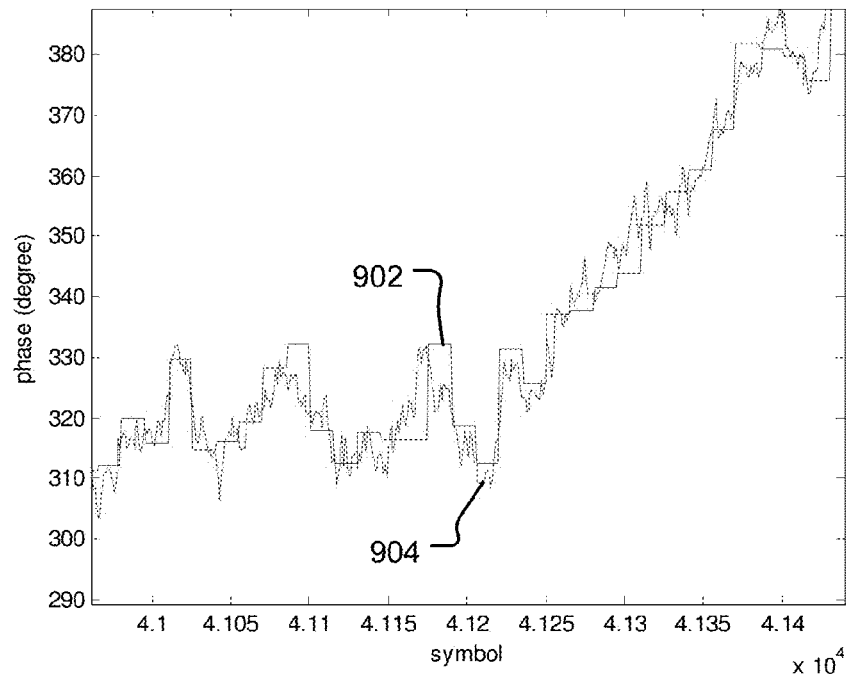
FIG. 9 includes plots of actual and estimate phase vs. symbol number showing performance of a system consistent with the present disclosure.
Figure 10:
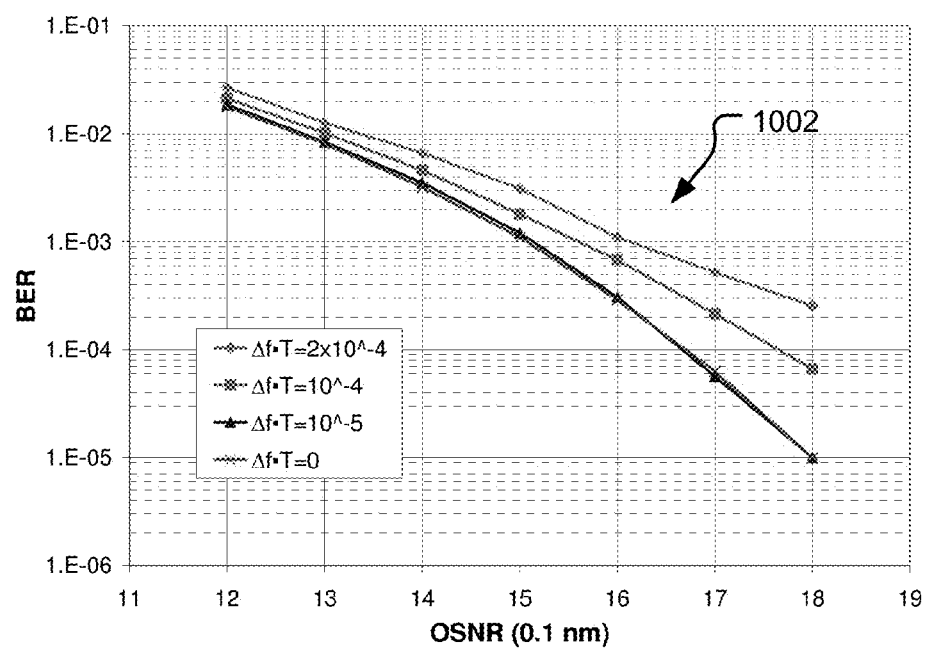
FIG. 10 includes plots of BER vs. OSNR showing performance of a system consistent with the present disclosure.

Therefore, the block of recovered symbol is $X=\exp(-j\tilde{\phi}_j)Y=\exp(-j\tilde{\phi}_j-j\phi_{ML})Y$ FIGS. 9 and 10 illustrate performance of a system using the above referenced modified BPS algorithm followed by a ML phase estimate with a block size, Y, of 30 symbols and true carrier phase noise. FIG. 9 includes plots 902, 904 of actual and detected carrier phase vs. symbol number using modified BPS/ML phase tracking in a system consistent with the present disclosure. As shown, there is no error propagation from one block of data into the next block of data and cycle slip is avoided. FIG. 10 includes plots 1002 of bit error rate (BER) vs. optical signal to noise ratio illustrating line-width performance in a system consistent with the present disclosure using n=10 information bits and 2 parity bits and mapped to three 16QAM symbols (12 bits) and modified BPS/ML phase tracking.

Figure 11:
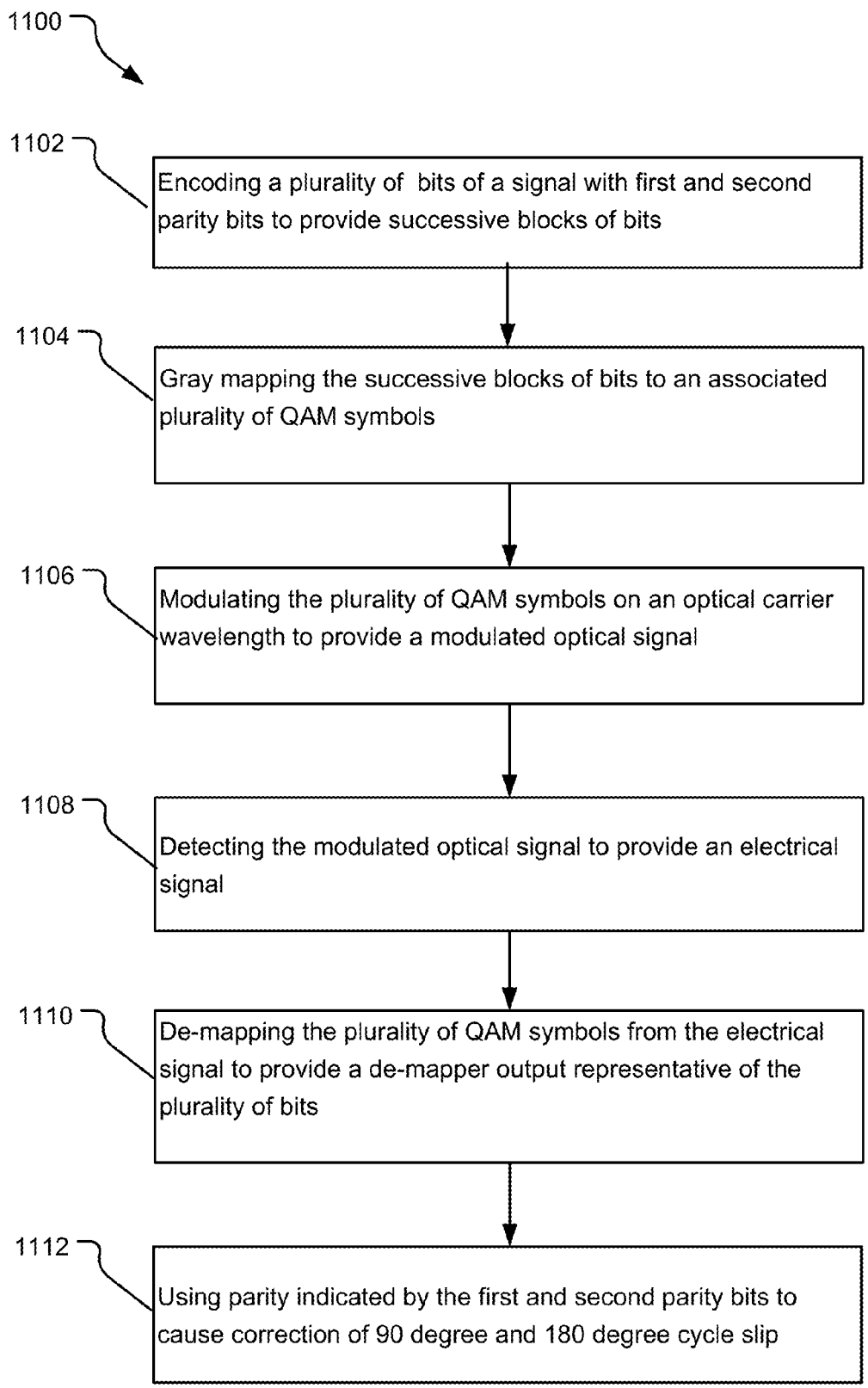
FIG. 11 is a flow chart illustrating one exemplary method consistent with the present disclosure.

FIG. 11 is a flow chart illustrating a method 1100 consistent with the present disclosure. Operation 1102 includes encoding a plurality of bits, e.g. n bits, of a signal with first and second parity bits to provide successive blocks of bits, e.g. blocks of n+2 bits. The successive blocks of bits are Gray mapped 1104 to an associated plurality of QAM symbols which are modulated 1106 on an optical carrier wavelength to provide a modulated optical signal. The modulated optical signal is detected 1108 to provide an electrical signal, and the plurality of QAM symbols are de-mapped 1110 from the electrical signal to provide a de-mapper output representative of the plurality of bits. The parity indicated by the first and second parity bits is used 1112 to cause correction of 90 degree and 180 degree cycle slip.

Figure 12:
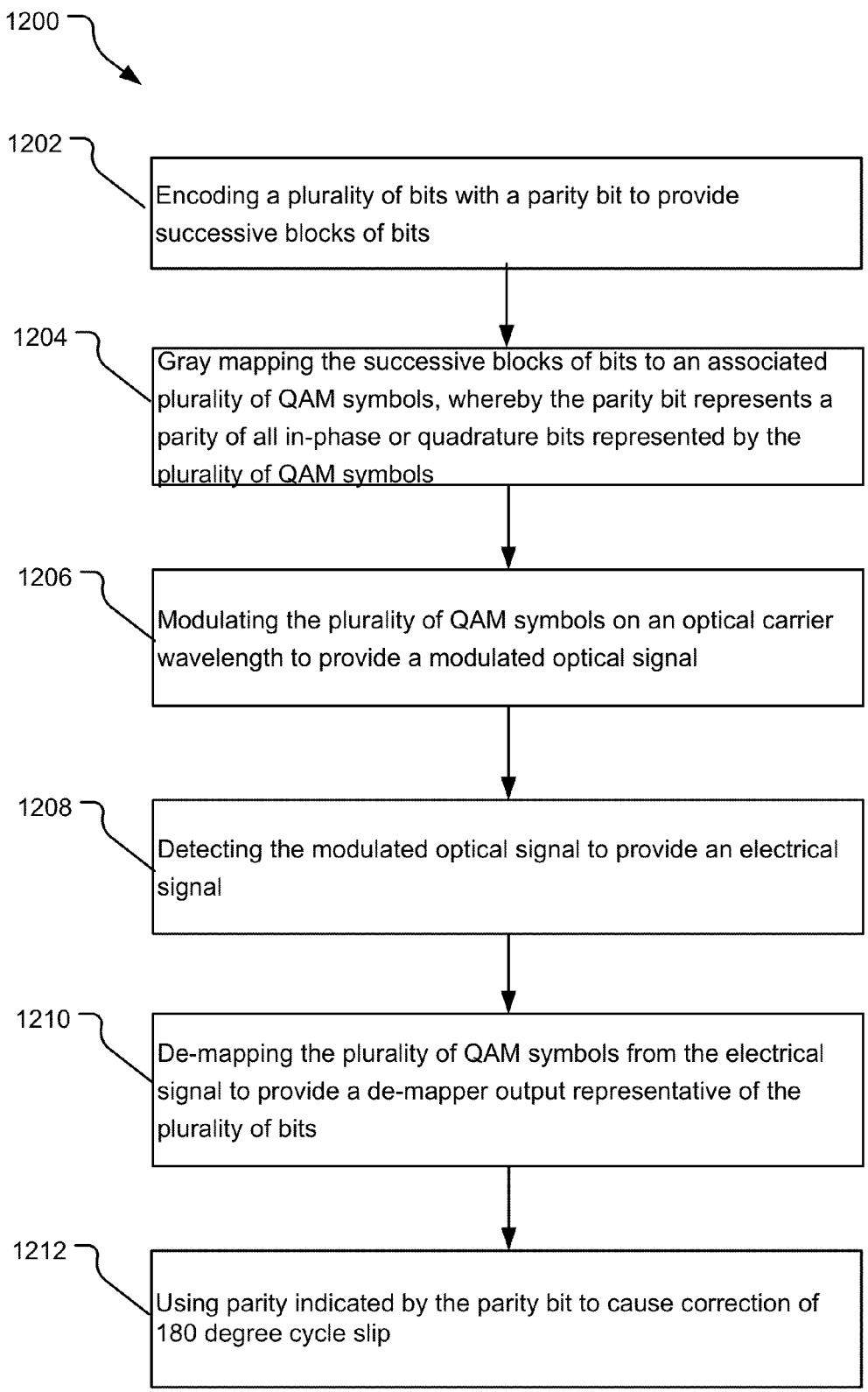
FIG. 12 is a flow chart illustrating another exemplary method consistent with the present disclosure.

The present disclosure is also generally directed to use of parity bit indicating parity of the in-phase or quadrature bits of a group of QAM symbols to correct 180 cycle slip. FIG. 12 is a flow chart illustrating a method 1200 of correcting for 180 degree cycle slip consistent with the present disclosure. Operation 1202 includes encoding a plurality of bits of a signal with a parity bit to provide successive blocks of bits. The successive blocks of bits are Gray mapped 1204 to an associated plurality of QAM symbols, whereby the parity bit represents a parity of all in-phase or quadrature bits represented by the plurality of QAM symbols, and QAM symbols are modulated 1206 on an optical carrier wavelength to provide a modulated optical signal. The modulated optical signal is detected 1208 to provide an electrical signal, and the plurality of QAM symbols are de-mapped 1210 from the electrical signal to provide a de-mapper output representative of the plurality of bits. The parity indicated by the parity bit is used 1212 to cause correction of 180 degree cycle slip.

While FIGS. 11 and 12 illustrate various operations according to exemplary embodiments, it is to be understood that not all of the operations depicted in FIG. 11 or FIG. 12 are necessary for other embodiments. Indeed, it is fully contemplated herein that in other embodiments of the present disclosure, the operations depicted in FIG. 11 and/or FIG. 12 and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

According to one aspect of the disclosure there is provided a system including a parity bit encoder configured to encode a plurality of bits with a first parity bit and a second parity bit to provide successive blocks of bits; a Gray mapper coupled to the parity bit encoder and configured to map each one of the blocks of bits to an associated plurality of quadrature amplitude modulated (QAM) symbols; a modulator coupled to the Gray mapper and configured to modulate an optical signal in response to an output of the Gray mapper to provide a modulated optical signal including the associated plurality of QAM symbols; a detector for receiving the modulated optical signal and providing an electrical signal representative of the optical signal; and a de-mapper configured to provide a de-mapper output representative of the plurality of bits in response to the electrical signal, the de-mapper being further configured to cause correction of 90 degree and 180 degree cycle slip using parity indicated by the first and second parity bits.

According to another aspect of the disclosure, there is provided a method including encoding a plurality of bits with first and second parity bits to provide successive blocks of bits; Gray mapping the successive blocks of bits to an associated plurality of QAM symbols, whereby the first parity bit indicates a parity of all bits represented by the plurality of QAM symbols and the second parity bit represents a parity of all in-phase or quadrature bits represented by the plurality of QAM symbols; modulating the plurality of QAM symbols on an optical carrier wavelength to provide a modulated optical signal; detecting the modulated optical signal to provide an electrical signal; de-mapping the plurality of QAM symbols from the electrical signal to provide a de-mapper output representative of the plurality of bits; and using parity indicated by the first and second parity bits to cause correction of 90 degree and 180 degree cycle slip.

According to another aspect of the disclosure there is provided a method including encoding a plurality of bits with a parity bit to provide successive blocks of bits; Gray mapping the successive blocks of bits to an associated plurality of QAM symbols, whereby the parity bit represents a parity of all in-phase or quadrature bits represented by the plurality of QAM symbols; modulating the plurality of QAM symbols on an optical carrier wavelength to provide a modulated optical signal; detecting the modulated optical signal to provide an electrical signal; de-mapping the plurality of QAM symbols from the electrical signal to provide a de-mapper output representative of the plurality of bits; and using parity indicated by the parity bit to cause correction of 180 degree cycle slip.

Embodiments of the methods described herein may be implemented using a processor and/or other programmable device. To that end, the methods described herein may be implemented on a tangible, computer readable storage medium having instructions stored thereon that when executed by one or more processors perform the methods. Thus, for example, the transmitter and/or receiver may include a storage medium (not shown) to store instructions (in, for example, firmware or software) to perform the operations described herein. The storage medium may include any type of tangible medium, for example, any type of disk including floppy disks, optical disks, compact disk read-only memories (CD-ROMs), compact disk re-writables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

It will be appreciated by those skilled in the art that any block diagrams herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The functions of the various elements shown in the figures, including any functional blocks, may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

As used in any embodiment herein, "circuitry" may comprise, for example, singly or in any combination, hardwired circuitry, programmable circuitry, state machine circuitry, and/or firmware that stores instructions executed by programmable circuitry. In at least one embodiment, the transmitter and receiver may comprise one or more integrated circuits. An "integrated circuit" may be a digital, analog or mixed-signal semiconductor device and/or microelectronic device, such as, for example, but not limited to, a semiconductor integrated circuit chip.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A system comprising:
   a parity bit encoder configured to encode a plurality of bits with a first parity bit and a second parity bit to provide successive blocks of bits;
   a Gray mapper coupled to said parity bit encoder and configured to map each one of said blocks of bits to an associated plurality of quadrature amplitude modulated (QAM) symbols, whereby said first parity bit indicates a parity of all bits represented by said plurality of QAM symbols and said second parity bit represents a parity of all in-phase or quadrature bits represented by said plurality of QAM symbols;
   a modulator coupled to said Gray mapper and configured to modulate an optical signal in response to an output of said Gray mapper to provide a modulated optical signal comprising said associated plurality of QAM symbols;
   a detector for receiving said modulated optical signal and providing an electrical signal representative of said optical signal; and
   a de-mapper configured to provide a de-mapper output representative of said plurality of bits in response to said electrical signal, said de-mapper being further configured to cause correction of 90 degree and 180 degree cycle slip using parity indicated by said first and second parity bits.

2. A system according to claim 1, wherein said first parity bit indicates a parity of all bits represented by said plurality of QAM symbols and said second parity bit represents a parity of all in-phase or quadrature bits represented by said plurality of QAM symbols.

3. A system according to claim 1, wherein said plurality of bits consists of n bits, and successive blocks of bits consists of n+2 bits.

4. A system according to claim 1, wherein said plurality of QAM symbols comprises an odd number of QAM symbols.

5. A system according to claim 1, wherein said QAM symbols are $M^2$-QAM symbols.

6. A system according to claim 1, wherein said de-mapper is configured to provide said de-mapper output using a modified blind phase search (BPS) algorithm without phase ambiguity followed by maximum-likelihood (ML) phase estimate.

7. A method comprising:
   encoding a plurality of bits with first and second parity bits to provide successive blocks of bits;
   Gray mapping said successive blocks of bits to an associated plurality of QAM symbols, whereby said first parity bit indicates a parity of all bits represented by said plurality of QAM symbols and said second parity bit represents a parity of all in-phase or quadrature bits represented by said plurality of QAM symbols;
   modulating said plurality of QAM symbols on an optical carrier wavelength to provide a modulated optical signal;
   detecting said modulated optical signal to provide an electrical signal;
   de-mapping said plurality of QAM symbols from said electrical signal to provide a de-mapper output representative of said plurality of bits; and
   using parity indicated by said first and second parity bits to cause correction of 90 degree and 180 degree cycle slip.

8. A method according to claim 7, wherein said first parity bit indicates a parity of all bits represented by said plurality of QAM symbols and said second parity bit represents a parity of all in-phase or quadrature bits represented by said plurality of QAM symbols.

9. A method according to claim 7, wherein said plurality of bits consists of n bits, and successive blocks of bits consists of n+2 bits.

10. A method according to claim 7, wherein said plurality of QAM symbols comprises an odd number of QAM symbols.

11. A method according to claim 7, wherein said QAM symbols are $M^2$-QAM symbols.

12. A method according to claim 7, wherein said de-mapping is performed using a modified blind phase search (BPS) algorithm without phase ambiguity followed by maximum-likelihood (ML) phase estimate.

13. A method comprising:
   encoding a plurality of bits with a parity bit to provide successive blocks of bits;
   Gray mapping said successive blocks of bits to an associated plurality of QAM symbols, whereby said parity bit represents a parity of all in-phase or quadrature bits represented by said plurality of QAM symbols;
   modulating said plurality of QAM symbols on an optical carrier wavelength to provide a modulated optical signal;
   detecting said modulated optical signal to provide an electrical signal;
   de-mapping said plurality of QAM symbols from said electrical signal to provide a de-mapper output representative of said plurality of bits; and
   using parity indicated by said parity bit to cause correction of 180 degree cycle slip.

14. A method according to claim 13, wherein said plurality of bits consists of n bits, and successive blocks of bits consists of n+2 bits.

15. A method according to claim 13, wherein said plurality of QAM symbols comprises an odd number of QAM symbols.

16. A method according to claim 13, wherein said QAM symbols are $M^2$-QAM symbols.

17. A method according to claim 13, wherein said de-mapping is performed using a modified blind phase search (BPS) algorithm without phase ambiguity followed by maximum-likelihood (ML) phase estimate.

* * * * *